United States Patent [19]

Kondo

[11] Patent Number: 4,535,722
[45] Date of Patent: Aug. 20, 1985

[54] APPARATUS FOR APPLYING MOLTEN WAX ONTO PRINTED CIRCUIT BOARD

[75] Inventor: Kenshi Kondo, Tokyo, Japan

[73] Assignee: Nihon Den-Netsu Keiki Co., Ltd., Tokyo, Japan

[21] Appl. No.: 556,187

[22] Filed: Nov. 29, 1983

[30] Foreign Application Priority Data

Dec. 1, 1982 [JP] Japan .................. 57-209287

[51] Int. Cl.³ .............................................. B05B 12/00
[52] U.S. Cl. ................................. 118/692; 118/688; 118/315; 239/124; 239/126
[58] Field of Search .................... 118/315, 692, 688; 427/96; 239/124, 126

[56] References Cited

U.S. PATENT DOCUMENTS

| | | | |
|---|---|---|---|
| 1,743,245 | 1/1930 | Smith | 239/126 |
| 2,374,041 | 4/1945 | Saha | 239/124 X |
| 2,817,600 | 12/1957 | Yahnke | 118/315 |
| 3,013,445 | 12/1961 | Enssle | 118/679 X |
| 3,250,247 | 5/1966 | Beaman | 118/315 |
| 3,463,397 | 8/1969 | Mecklin et al. | 239/126 |
| 3,756,466 | 9/1973 | Haase | 239/126 X |
| 4,106,699 | 8/1978 | Holt | 239/124 |
| 4,269,870 | 5/1981 | Boynton | 427/96 |
| 4,432,301 | 2/1984 | Diesel | 118/315 |

Primary Examiner—Shrive P. Beck
Attorney, Agent, or Firm—Stephen F. K. Yee

[57] ABSTRACT

An apparatus for applying molten wax onto a printed circuit board travelling along a predetermined transfer path. The applied wax after solidification serves to fix the electric components mounted on the board, facilitating the succeeding operations such as cutting and soldering. The apparatus includes a vessel for containing a molten wax, a plurality of ejection nozzles arranged in a direction transverse to the transfer path, valve means connected to each of the ejection nozzles and operable so that the molten wax is ejection from each nozzle upon actuation of the corresponding valve means, and a pump, such as a gear pump, having a suction side in fluid communication with the vessel and a discharge side in fluid communication with each of the valve means. Means are provided for selectively rendering the valve means operable according to the width of the printed circuit board.

7 Claims, 6 Drawing Figures

APPARATUS FOR APPLYING MOLTEN WAX ONTO PRINTED CIRCUIT BOARD

BACKGROUND OF THE INVENTION

This invention relates generally to the processing of printed circuit boards having mounted thereon electric components for forming good solder joints. More particularly, the present invention is concerned with an apparatus for applying molten wax over the component side of the printed circuit board, the applied wax after solidification serving as a bond for the fixation of the electric components to the printed circuit board.

For the purpose of providing uniform, steady joints between component leads and circuits printed on the board, a technique is proposed in which the electric components-bearing board is first subjected to a dip soldering treatment for providieng temporary joints between the electric components and the board and the resultant board, after cutting the leads depending from the underside of the board, is contacted with a standing wave of molten solder ejected from a nozzle.

This technique, however, suffers from drawbacks that the quality of the electrical components may be deteriorated through the double soldering treatments and the apparatus becomes large in structure. Moreover, the contact of the temporarily joined components with the ejected, running molten solder may cause the leads to come off from the through holes of the board.

SUMMARY OF THE INVENTION

The present invention provides an apparatus for applying molten wax onto a printed circuit board travelling along a predetermined transfer path, which comprises a vessle for containing a molten wax, a plurality of ejection nozzles arranged in a direction transverse to the transfer path, valve means connected to each of the ejection nozzles and operable so that the molten wax is ejected from each nozzle onto the printed circuit board travelling adjacent thereto upon actuation of the corresponding valve means, a pump having a suction side in fluid communication with the vessel and a discharge side in fluid communication with each of the valve means, and means for selectively rendering the valve means operable according to the width of the printed circuit board.

It is, therefore, an object of the present invention to provide an apparatus for applying molten wax onto printed circuit boards travelling along a predetermined transfer path.

Another object of the present invention is to provide an apparatus of the above-mentioned type which is simple and compact in construction and which can apply a controlled amount of the molten wax onto the printed circuit boards.

BRIEF DESCRIPTION OF THE DRAWINGS

Other objects, features and advantages of the present invention will become apparent from the detailed description of the preferred embodiments of the invention which follows, when considered in light of the accompanying drawings, in which.

DETAILED DESCRIPTION OF THE PREFERRED EMBODIMENTS OF THE INVENTION

Figure 1:
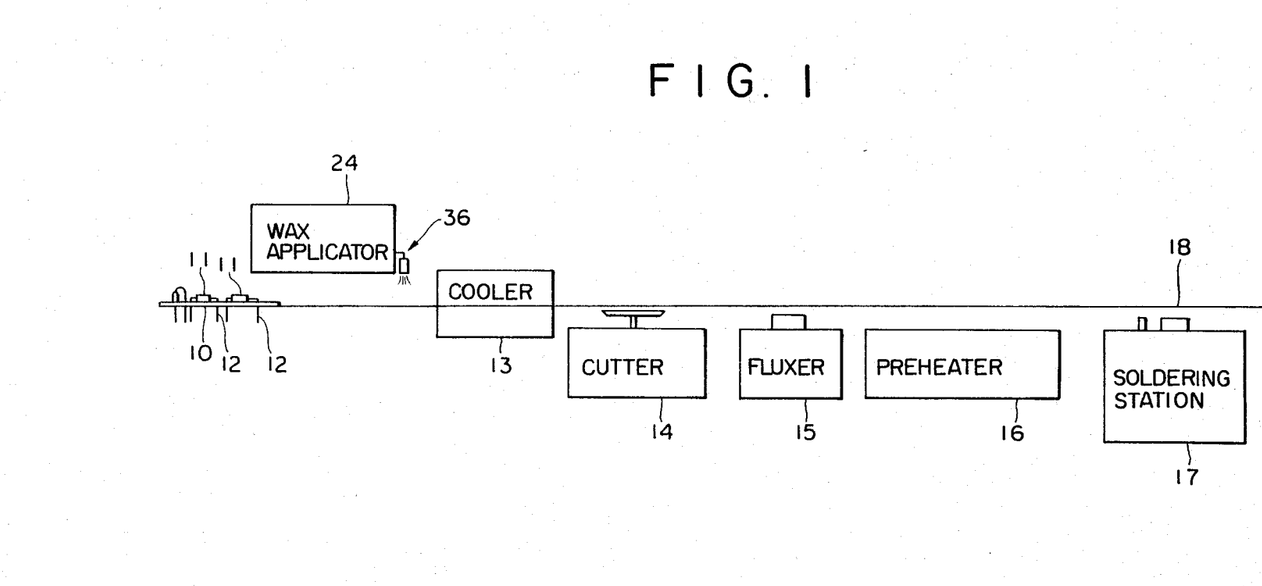
FIG. 1 is a flow diagram schematically showing a series of work stations arranged for soldering printed circuit boards, including a wax-applying station according to the present invention.

Referring first to the flow diagram of FIG. 1, a printed circuit board 10, having the leads 12 of electric components 11 inserted therethrough is conveyed along a predetermined path 18 by means known per se such as a sprocket and chain mechanism. During its passage along the path 18, the board 10 is subjected to a series of treatments for firmly uniting the circuit printed on the board 10 with the leads 12 of respective components 11.

The board 10 passes first through a wax-applying apparatus 24 wherein the component side of the board 10 is applied with a molten wax injected from a plurality of transversely arranged injection means 36. Any wax, such as vegetable wax and petroleum wax, having a softening point generally 60° to 100° C. may be suitably used for applying onto the printed circuit board. The molten solder applied onto the board 10 and covering the components 11 solidifies during the passage of the board 10 through a cooler 13 so that the components 11 are fixed on the board with the space around the components 11 and the through holes of the board for receiving the leads 12 being filled with the solidified wax.

The leads 12 depending from the underside of the board 10 are cut by a cutter 14. Thereafter the underside of the board 10 is evenly applied with a liquid flux during the passage thereof above a fluxer 15 is preheated generally to 80°-90° C. by a preheater 16 to condition same suitable for receiving molten solder in the succeeding soldering station 17.

Figure 2:
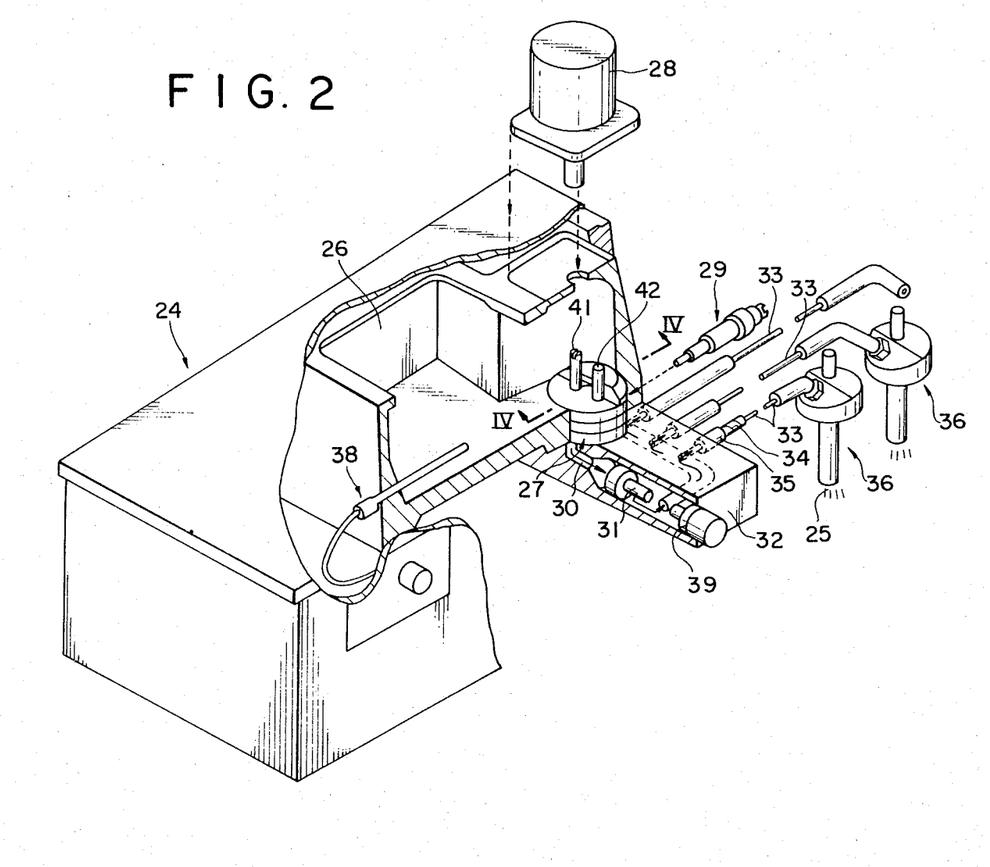
FIG. 2 is a perspective view, partly cut away, diagrammatically showing one embodiment of the wax-applying apparatus according to the present invention.

An embodiment of the wax-applying apparatus 24 is shown in FIG. 2. The wax-applying appartus 24 includes a vessel 26 for containing a molten wax 25 maintained at a suitable temperature by means of a temperature control unit 38. A pump such as a gear pump 27 is received in the bottom of the vessel 26. The pump 27 has a suction side in fluid communication with the wax vessel 26 and a discharge side in fluid communication with a U-shaped fluid flow passage 30 defined in the body of a manifold 32. A drive shaft 41 securing a drive gear (not shown) extends from the pump housing and is connected to a drive motor 28.

A plurality of pipes 33 are connected at their one ends to respective ports of the manifold 32 for fluid communication with the U-shaped passage 30. The other end of each of the pipes 33 is connected to an ejection means 36. Thus, the gear pump 27 is operated by the actuation of the motor 28 to feed the molten wax 25 in the vessel 26 to the ejection means 36 through the fluid flow passage 30 of the manifold 32 and pipes 33 as shown by the arrow in FIG. 2, the molten wax being ejected from the ejection means 36 toward the printed circuit board (not shown) travelling adjacent thereto.

Indicated as 31 is a filter or strainer to prevent foreign solids from flowing therethrough. The filter 31 may be removed from the manifold 32 through a capped port 39 for cleaning. Each pipe 33 is surrounded by a heater element 34 such as a tape heater to maintain the wax flowing through the pipe 33 in the molten state. The heater element is covered with a suitable heat insulating sheath 35.

Figure 3:
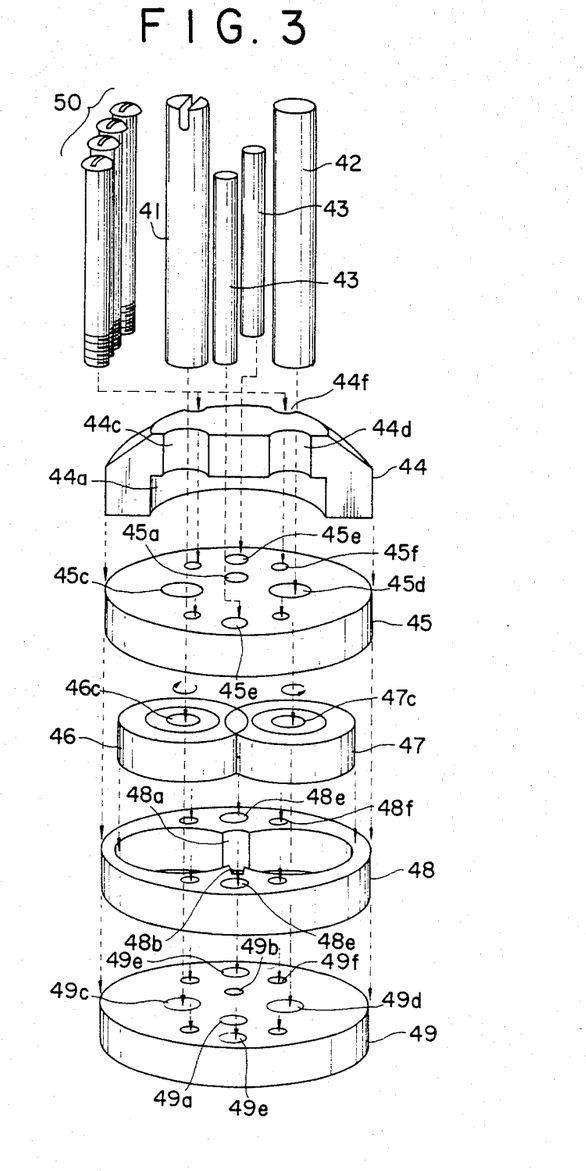
FIG. 3 is an exploded, explanatory view showing a gear pump of FIG. 2.

FIG. 3 depicts the construction of the gear pump 27 by way of an exploded view. A pair of externally meshed gears 46 and 47 are accommodated in a gear case 48. The gear case 48 has a pair of axial grooves 48a and 48b formed at its inside wall so that there are defined, when the case 48 receives the gears 46 and 47, suction side and discharge side chambers between the grooves 48a and 48b and the gears 46 and 47. The gear case is sandwiched between an upper plate 45 provided with an inlet opening 45a and a lower plate 49 provided with an outlet opening 49a and a return opening 49b.

The lower plate 49 has a pair of bores 49c and 49d for rotatably receiving the gear shafts 41 and 42 which are inserted through central through holes of the gears 46 and 47 and fixedly secured to the gears 46 and 47 for rotation therewith, respectively. The upper plate 45 is formed with a pair of through holes 45c and 45d for the insertion of the shafts 41 and 42 therethrough, respectively.

The upper and lower plates 45 and 49 and the gear case 48 are each provided with a pair of opposite guide holes 45e, 49e and 48e, and also with four angularly equally spaced apart through holes 45f, 49f and 48f, respectively, for the insertion of four fixing screws 50 therethrough. Preferably, the upper plate 45 is overlaid with a cover member 44 provided with an opening or a concaved portion 44a for open communication with the inlet opening 45a of the upper plate 45. The cover 45d is formed with a pair of guide openings or grooves 44c and 45d through which are inserted the shafts 41 and 42 to prevent the lateral movement of the gear shafts and to ensure smooth rotation of the gear shafts. The cover 44 is also provided with opening 44f for the insertion of the fixing screws 50.

As will be seen from FIG. 3, the through holes of the upper and lower plates 45 and 49, gear case 48 and the cover 44 are positioned so that the two gear shafts 41 and 42, two guide bars 43 and four fixing screws 50 can be simultaneously inserted in respective through holes to form a suction side fluid passage defined by the opening 44a, inlet opening 45a and the groove 48a and a discharge side fluid passage defined by the groove 48b and outlet opening 49a, with the return opening 49b being in fluid communication with the suction side flow passage.

In constructing the gear pump 27, the lower plate 49 is first placed on the manifold 32 so that the outlet opening 49a faces on the open end of the fluid flow passage 30 of the manifold 32. The gear shafts 41 and 42 and the two guide bars 43 are then inserted into the bores 49c, 49d and 49e, respectively. The gears which are meshing engagement with each other are fixedly mounted on the shafts 41 and 42, respectively, by any suitable means such as set screws. The gear case 48, upper plate 45 and cover 44 are then mounted on the lower plate 49. The entire structure is subsequently unitedly fixed by means of the screws 50 to the manifold 32. The motor 28 is finally mounted on the vessel 26 with its drive shaft being connected to the gear shaft 41 (see FIG. 2).

Figure 4:
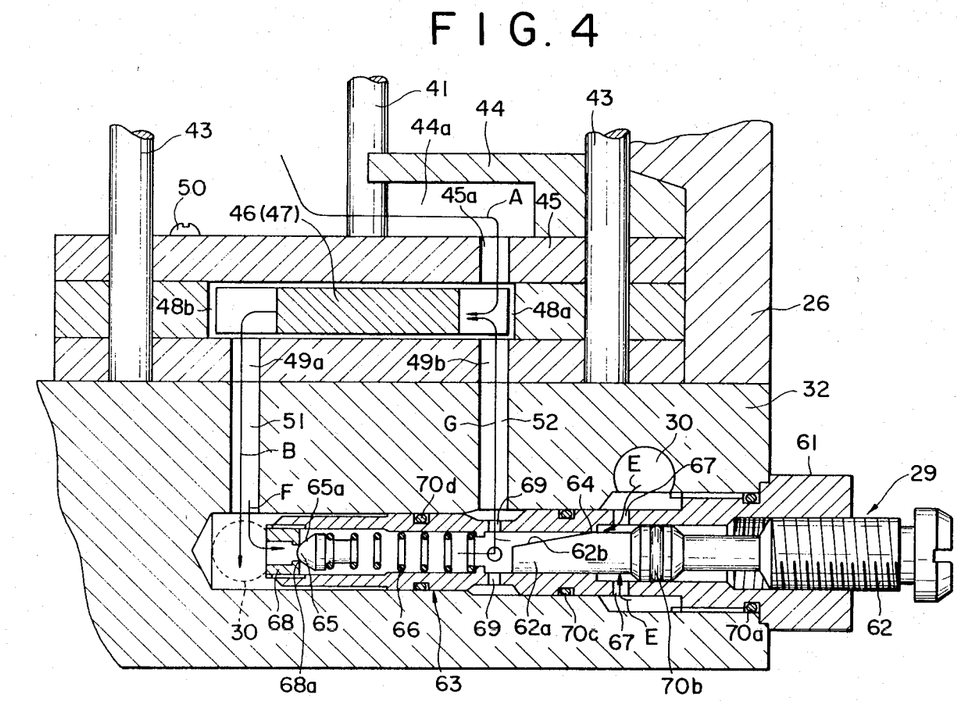
FIG. 4 is a fragmentary, cross-sectional view taken on line IV—IV of FIG. 2.

In order to control the flow rate of the molten wax through respective pipes 33, the wax-applying apparatus 24 of the present invention is desirably provided with a flow control valve. FIG. 4 shows a preferred embodiment of the flow control valve 29 fitted in a bore of the manifold 32. The valve 29 has a valve casing 61 meshed into a bore of the manifold 32. The valve casing 61 is provided with an inlet port 67 at a position to communicate with the fluid flow passage 30 of the manifold 32 and an outlet port 69 at a position to communicate with a return passage 52 which is formed within the manifold 32 and which is in fluid communication with the return opening 49b.

A valve stem 62 which is threaded into the casing 61 is movable in axial direction by rotation thereof together with its valve plug 62a so that the gap between a valve face 62b of the valve plug 62a and a valve seat 64 of the valve casing 61 can be adjusted to control the flow rate of the molten wax flowing through the return passage 52, i.e. the flow rate at respective ejection means 36.

The flow control valve 29 of FIG. 4 is further provided with a safety valve 63 which serve to maintain the pressure within the fluid flow passage 30 below a predetermined value. The vavle casing 61 has an open end threaddedly provided with an inlet mouth 68 which opens into one end of the U-shaped fluid flow passage 30 and is formed with an annular valve seat 68a. A safety valve plug 65 is provided for axial movement within the casing 61 and has an end face 65a abutting engagement with the valve seat 68a. The valve plug 65 is constantly pressed by a coil spring 66 to urge the valve face 65a in engagement with the valve seat 68a. The biasing force of the coil spring 66 may be adjusted by turning the mouth 68 in a suitable direciton. Indicated as 70a, 70b, 70c and 70d are sealing means such as O-rings.

The flow control valve 29 with a built-in safety valve 63 is operated as follows. Upon rotation of the drive shaft 41 by actuation of the motor 28, the gears 46 and 47 are rotated so that the molten wax in the vessel 26 passes successively through the opening 44a of the cover plate 44, the inlet opening 45a of the upper plate 45, the groove 48a of the gear case 48, the groove 48b of the gear case 48, the outlet opening 49a of the lower plate 49 and the inlet port 51 communicated with the U-shaped fluid flow passage 30 of the manifold, as shown by the arrows A and B. The molten wax introduced into the passage 30 is then flown through the pipes 33 ejected from the ejection means 36 upon actuation thereof. In this case, a portion of the molten wax within the fluid flow passage 30 is recycled to the suction side of the pump 27 through the gap between the valve seat 64 and the valve face 62b of the control valve 29, the discharge port 69, the return passage 52 and the return opening 49b as shown by the arrows E and G in FIG. 4, the amount of the recycled wax being adjustable by the control of the valve 29. Therefore, the flow rate of the molten wax ejected from the ejection means 36 may be controlled by the valve 29. Since the amount of the molten wax applied onto the printed circuit board is desired to be changed according to the kind of electric components mounted thereon and since the number of the ejection means rendered operable is desired to be varied according to the width of the printed circuit board, the provision of the flow control valve 29 is very preferable.

The pressure within the passage 30 increases when the ejection means stop operating. When the pressure exceeds a predetermined value, the plug 65 is displaced against the biasing force of the spring 66 to direct a portion of the wax in the passage 30 through the safety valve to the return passage 52 as shown by the arrows F and G. By turning the mouth 68, the pressure at which the safety valve actuates may be adjusted.

Figure 5:
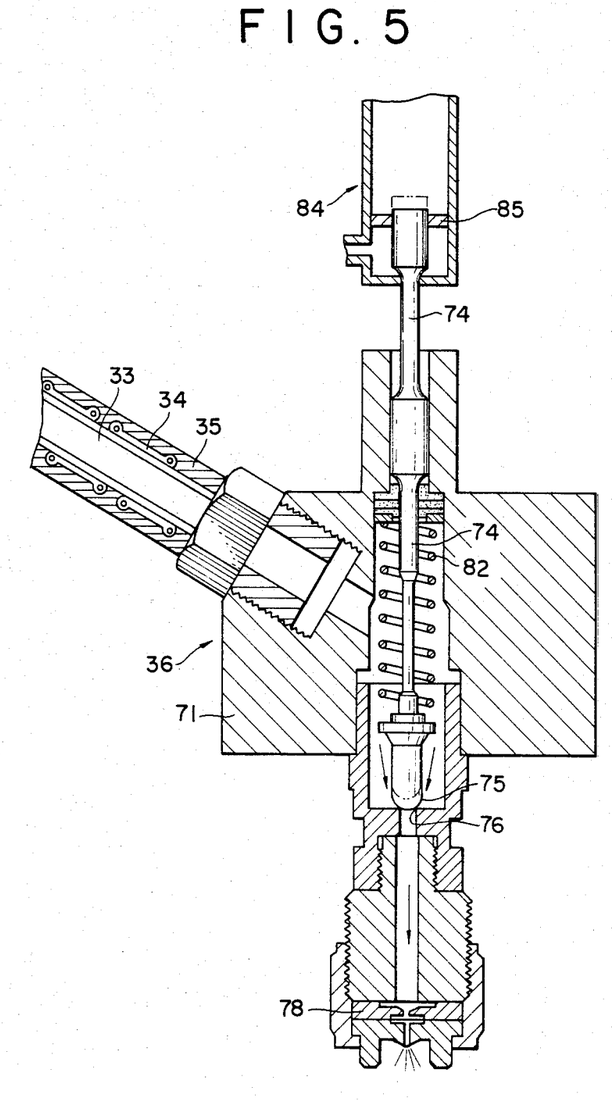
FIG. 5 is a vertical, cross-sectional view diagrammatically showing one embodiment of an ejection nozzle member according to the present invention.

FIG. 5 illustrates an example of the ejection means 36. The ejection means 36 includes a valve casing 71 to which are connected the pipe 33 and a nozzle member 78. Indicated as 74 is a valve stem having its one end formed with a valve face 75 and the other end securing a piston 85 slidably held in air cylinder 84 supported by a stationary support (not shown). The valve face 75 is engageable with a valve seat 76 formed within the valve casing 71 to prevent fluid flow from the pipe 33 to the nozzle 78.

The valve stem 74 is fitted with a coil spring 82 so that the valve face 75 normally engages the valve seat 76. When the air cylinder 84 is actuated to dispace its piston 85 upward, the valve stem 74 connected to the piston 85 moves therewith, whereby the valve face 75 is disengaged from the valve seat 76. Thus, during the operation of the air cylinder 84, the molten wax is ejected from the nozzle member 78 towards the printed circuit board (not shown).

Figure 6:
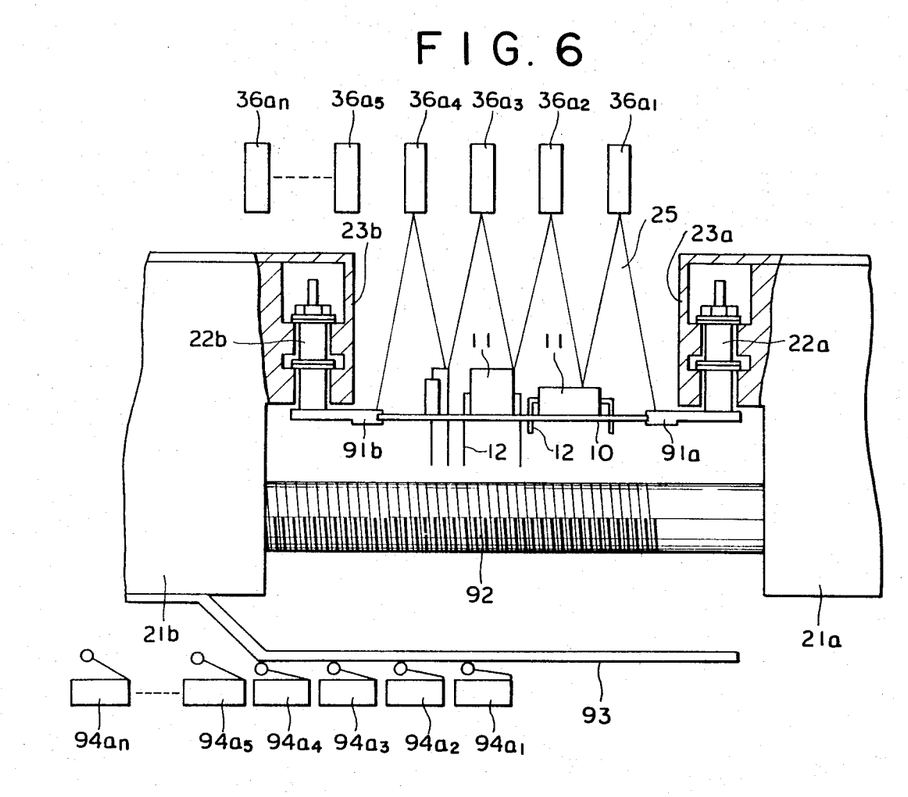
FIG. 6 is a front view, partly in cross-section, diagrammatically illustrating the manner of applying molten wax onto the printed circuit board by means of the invention apparatus.

It is preferred that a plurality of the ejection means be provided and arranged so that the nozzle members may be positioned in a direction transverse to the transfer path of the printed circuit board. In such a case, it is also preferred that selective number of thus arranged ejection means be actuated correspondingly to the width of the printed circuit board. FIG. 6 shows an embodiment of such an arrangement, in which the similar components are designated by the same reference numerals. The reference numerals 21a and 21b designate a pair of stationary and moveable base members each supporting thereon a sprocket and chain mechanism for conveying printed circuit boards 10.

The printed circuit boards 10 are supported at their both side ends by a plural pairs of holding members 91a and 91b respectively attached to a pair of parallel, endless transfer chains 22a and 22b. Such a mechanism for transferring the printing circuit boards is well known in the art.

The base members 21a and 21b are interconnected by an adjusting screw 92. One end of the screw 92 is rotatably received by the stationary base member 21a while the other end is in threaded engagement with the moveable base member 21b. By rotation of the screw 92, the moveable base member 21b is displaced toward or away from the stationary base member 21a according to the direction of rotation of the screw 92 so that the distance between the holding members 91a and 91b can be adjusted to a value suitable for supporting the printed circuit board therebetween. Indicated as 23a and 23b are guides provided on respective base members 21a and 21b for maintaining 22a and 22b in proper parallel orientation.

The moveable support member 21b is provided with an actuation member 93 arranged for engaging with a plurality of limit switches $94a_1, 94b_2, \ldots 94a_n$ electrically coupled with respectrive ejection means $36a_1, 36a_2, \ldots 36a_n$. The ejection means $36a_1, 36a_2, \ldots 36a_n$ are rendered operable only when their corresponding limit switches are in ON position by contact with the actuation member 93. Thus, each time the printed circuit board is positioned at a predetermined location, the selected number of the ejection means (four in this illustrated case) are simultaneously operated to eject molten wax 25 towards the printed circuit board 10, the number being automatically determined according to the position of the moveable base member 21b, i.e. the distance between the opposite holding members 91a and 91b, i.e. the width of the printed circuit board 10 to be processed.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

I claim:

1. An apparatus for applying molten wax onto a printed circuit board travelling along a predetermined transfer path, comprising a vessel for containing a molten wax, a plurality of ejection nozzles arranged in a direction transverse to the transfer path, individual valve means connected to each of the ejection nozzles and operable so that the molten wax is ejected from each nozzle onto the printed circuit board travelling adjacent thereto upon actuation of the corresponding valve means, a pump having an intake in fluid communication with the vessel and a discharge in fluid communication with each of the valve means, means for selectively rendering the valve means operable according to the width of the printed circuit board, and an adjustable flow control means in fluid communication with said ejection nozzles and having an inlet in fluid communication with the discharge of the pump and an outlet in fluid communication with the intake of the pump, said flow control means adjustable for controlling the rate of the flow of the molten wax through the ejection nozzles by diverting a controlled amount of the molten wax through the inlet and out of the outlet.

2. An apparatus as claimed in claim 1, further comprising a pressure-responsive safety valve having an intake port in fluid communication with the discharge of the pump and an outlet port in fluid communication with the intake of the pump and operable for diverting an amount of the molten wax discharged from the pump to the intake of the pump through the intake port and the outlet port when the pressure of the molten wax flowing through the discharge side of the pump exceeds a predetermined pressure.

3. An apparatus as claimed in claim 2, further comprising means for supporting the circuit board for travel along the transfer path, the support means being adjustable to accommodate circuit boards of different widths, and the selective valve operating means including actuation means coupled to the support means to control operation of selected ones of the valve means in response to the width-adjusted position of the support means.

4. An apparatus for applying molten wax onto a printed circuit board travelling along a predetermined transfer path, comprising:

a vessel for containing a molten wax;
a manifold integrally attached to the vessel and having formed therein a U-shaped fluid flow passage, a bore extending between first and second end portions of the U-shaped passage and a plurality of discharge ports each being in fluid communication with the U-shaped passage;

a gear pump mounted on the manifold and having a suction side opening into the vessel and a discharge side opening into the first end portion of the the U-shaped passage;

a return passage defined within the manifold and extending betwen the suction side of the gear pump and an intermediate portion of the bore;

an integrated pressure-responsive safety valve and flow control valve assembly disposed within the bore, said safety valve being operable when the pressure within the U-shaped passage exceeds a predetermined pressure for allowing a part of the molten wax to flow through the bore, from the first end portion of the flow passage to the return passage, said control valve being operable for controlling the rate of the flow of the molten wax through the U-shaped passage by diverting a controlled amount of the molten wax to the return passage; and a plurality of ejection means connected to respective discharge ports of the manifold for ejecting the molten wax therefrom towards the printed circuit board.

5. An apparatus as claimed in claim 4, further comprising means for controlling operation of selected ones of the plurality of ejection means according to the width of the printed circuit board.

6. An apparatus as claimed in claim 5, further comprising means for supporting the circuit board for travel along the transfer path, the support means being adjustable to accommodate circuit boards of different widths.

7. An apparatus as claimed in claim 6, wherein the selective valve operating control means includes activation means coupled to the support means to control operation of selected ones of the plurality of ejection means according to the width-adjusted position of the support means.

* * * * *